United States Patent
Friedrichs et al.

(10) Patent No.: US 7,206,178 B2
(45) Date of Patent: Apr. 17, 2007

(54) ELECTRONIC SWITCHING DEVICE

(75) Inventors: Peter Friedrichs, Nürnberg (DE); Gerd Griepentrog, Gutenstetten (DE); Reinhard Maier, Herzogenaurach (DE); Heinz Mitlehner, Uttenreuth (DE); Reinhold Schörner, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 610 days.

(21) Appl. No.: 10/450,408

(22) PCT Filed: Dec. 3, 2001

(86) PCT No.: PCT/DE01/04525

§ 371 (c)(1),
(2), (4) Date: Jun. 13, 2003

(87) PCT Pub. No.: WO02/49215

PCT Pub. Date: Jun. 20, 2002

(65) Prior Publication Data

US 2004/0027753 A1 Feb. 12, 2004

(30) Foreign Application Priority Data

Dec. 13, 2000 (DE) .............. 100 62 026

(51) Int. Cl.
*H02H 3/00* (2006.01)

(52) U.S. Cl. .................................... 361/93.1
(58) Field of Classification Search ............ 361/93.1

See application file for complete search history.

(56) References Cited

U.S. PATENT DOCUMENTS 4,945,266 A * 7/1990 Mori .................... 327/428
5,381,296 A * 1/1995 Ekelund et al. ........... 361/106

(Continued)

FOREIGN PATENT DOCUMENTS

DE 3445340 6/1986

(Continued)

OTHER PUBLICATIONS

Heil, Holger et al. "Mini-PROFETs in milli-smart technology: High-Side Smart Power Switches with all-round protection." Components XXXI, 1996, No. 4; pp. 20-22, no month.

*Primary Examiner*—Ronald W. Leja
(74) *Attorney, Agent, or Firm*—Harness, Dickey & Pierce, P.L.C.

(57) ABSTRACT

A switching device includes a working circuit, to which an operating voltage can be or is applied to which has at least one electronic switching element. This switching element includes at least one control terminal for applying a switching signal and is switched off or switched on depending on the switching signal. At least one electronic protection element is for protecting the switching element in its switched state from excessive Joule losses in the event of danger, especially in the event of an overload or a short circuit. The protection element bears the predominant part of the operating voltage that is released at the working circuit. The switching device includes a switching-off device, which, in the event of danger, automatically switches the switching element to the switched off state, using the energy contained in the operating current or the operating voltage passing through the working circuit or the voltage that is released at the working circuit or at the protection element exceeds a predetermined upper limit value.

53 Claims, 4 Drawing Sheets

U.S. PATENT DOCUMENTS

| | | | |
|---|---|---|---|
| 5,467,242 A * | 11/1995 | Kiraly | 361/94 |
| 5,559,656 A * | 9/1996 | Chokhawala | 361/18 |
| 5,844,760 A * | 12/1998 | Kumagai et al. | 361/58 |
| 5,999,387 A * | 12/1999 | Roesch et al. | 361/58 |
| 6,049,447 A | 4/2000 | Roesch et al. | |
| 6,072,678 A * | 6/2000 | Degen | 361/58 |
| 6,181,541 B1 * | 1/2001 | Souri et al. | 361/106 |

FOREIGN PATENT DOCUMENTS

| | | |
|---|---|---|
| DE | 19610135 | 5/2000 |
| WO | WO 94/11937 | 5/1994 |
| WO | WO 95/07571 | 3/1995 |
| WO | WO 95/24055 | 9/1995 |
| WO | WO 00/24105 | 4/2000 |
| WO | 19833214 | 2/2002 |

* cited by examiner

ELECTRONIC SWITCHING DEVICE

This application is the national phase under 35 U.S.C. § 371 of PCT International Application No. PCT/DE01/04525 which has an International filing date of Dec. 3, 2001, which designated the United States of America and which claims priority on German Patent Application number DE 100 62 026.4 filed Dec. 13, 2000, the entire contents of which are hereby incorporated herein by reference.

FIELD OF THE INVENTION

The invention generally relates to a switching device.

BACKGROUND OF THE INVENTION

In order to supply an electrical load (device) with electrical energy or power, the load is generally connected to a line branch of an electrical supply power system via a switching unit (a switching device).

The switching unit, which is connected into the line branch upstream of the load, is provided for switching the electrical current for the electrical load on and off. During normal operation (rated operation), the switching unit switches the rated currents necessary for the electrical load. In particular situations, for example when switching on, the load may require significantly higher electrical powers and as a result the electric current flowing through the switching unit may be significantly higher than the rated current. The term overload current is then used. Finally, the resistance of the load may drop drastically or disappear as a result of a short circuit in the electrical load or in the lines leading to the load, and the electric current flowing through the switching unit may consequently assume very high values. These high short circuit currents lead to a high power loss in the switching unit and load and as a result very quickly to the switching unit or load being damaged or destroyed. For this reason, the switching units and loads must be protected from overload currents or short circuit currents which flow for an excessively long time. For this purpose, special protection devices are used which, in order to protect the load from excessively high currents, disconnect the line branch from the supply power system if such a critical current occurs. Fusible links, circuit breakers or power circuit breakers are usually used as protection units.

Switching units which are themselves able to withstand overloading or short circuits, and are therefore also referred to as intrinsically safe switching units, are desirable for providing protection from overload currents and short circuit currents. Such intrinsically safe switching units are intended to protect themselves and the line branch automatically so that when such switching units are used it is not possible for there to be any damage in the branch due to short circuit currents or overload currents.

In addition to the predominantly used mechanical switching units with switching contacts, electronic switching units, implemented using semiconductor components, are known for switching electrical currents. Such semiconductor components can be divided into current-controlled semiconductor components, including bipolar transistors and thyristors, on the one hand, and voltage-controlled semiconductor components such as the unipolar MOS (Metal Oxide Semiconductor) field effect transistors (MOSFETs) or the bipolar MOS-controlled thyristors (MCTs) or the MOS-controlled bipolar transistors (IGBTs), on the other hand. All the aforesaid semiconductor components can be switched only currents in one current direction (forward direction), i.e. only when there is a specific polarity of the applied operating voltage between an on state and an off state (switchable state). In its switched off state, each semiconductor component can switch off only up to a maximum off-state voltage (breakdown voltage). With relatively high off-state voltages there is a charge carrier breakdown which can quickly result in the component being destroyed.

WO 95/24055 A1 discloses an electrical switching device in which a semiconductor component with two FETs connected in an antiserial configuration and an interrupter contact on each side of the semiconductor component are connected into a line section.

The interrupter contacts are switched on or off by a triggering element which is connected in parallel with the semiconductor component. A control voltage of a control device is applied between the gate and source of the two FETs. A current sensor to which the control device is connected is arranged in the line section. The control device checks when a permissible short circuit current is reached or exceeded and then sets the control voltage for the two FETs in such a way that the permissible short circuit current is not exceeded by increasing the internal resistance of the FETs by way of the control voltage. The control device generates the control voltage using auxiliary energy (extraneous energy). The signal of the current sensor is used only for evaluating when a short circuit situation occurs, and when one does not occur.

WO 95/07571 A1 discloses an a.c. power controller with two MOSFETs which are connected in an antiserial configuration and are based on silicon carbide. Each SiC MOSFET can be driven via a separate gate-source control voltage. The gate-source voltage is set to have such a magnitude in the forward direction that there is a desired limitation of the drain-source current and in the inverse operating mode it is only so large that the internal body diodes of the MOSFETs are still currentless. As a result of the current limiting property of this circuit, it is possible to limit short circuit currents to an acceptable level and reduce them by means of gate-source voltages which are reduced so as to run appropriately. The gate-source voltages are generated using an external energy source.

DE 196 10 135 C1 discloses an electronic switching device which has two electrical connections for applying electrical operating voltages, a semiconductor component based on silicon (silicon component) and additionally a semiconductor arrangement.

The semiconductor arrangement comprises a first semiconductor region of a predefined conduction type and at least one further semiconductor region of the opposite conduction type, between which in each case a p-n type junction is formed. The semiconductor regions are each formed using a semiconductor with a breakdown field strength of at least $10^6$ V/cm, in particular diamond, aluminum nitride (AlN), gallium nitride (GaN), indium nitride (InN) and preferably silicon carbide (SiC), in particular of the polytypes 3C, 4H and/or 6H.

At least one channel region which adjoins the p-n type junction in the first semiconductor region of the semiconductor arrangement is then electrically connected in series to the silicon component between the two terminals. The silicon component has an on state and an off state at operating voltages of a predefined polarity. The p-n type junction of the semiconductor arrangement is electrically connected between the two terminals in the off direction for the operating voltages. If the silicon component is in its off state, the depletion zone of the at least one p-n type junction chokes off the channel region in the first semiconductor region or even covers the entire channel region.

As a result, in the off state of the silicon component, the greater part of the operating voltage between the two terminals already drops across the depletion zone of the p-n type junction. Owing to the high breakdown field strength of at least $10^6$ V/cm of the semiconductor which is provided for the semiconductor regions of the p-n type junction, the p-n type junction of the semiconductor arrangement can carry significantly higher off-state voltages than a p-n type junction which is formed in silicon and has the same charge carrier concentrations and dimensions. The breakdown field strength of silicon is, in comparison, approximately $2 \cdot 10^5$ V/cm. The silicon component therefore has to be configured only for the remaining part of the off-state voltage between the two terminals. This in turn results in a significantly reduced power loss of the silicon component in the on-state operating mode. In addition, the entire operating voltage between the two terminals is applied as an off-state voltage at the p-n type junction of the semiconductor arrangement in the other circuit branch. In the on state of the silicon component, the channel region in the first semiconductor region of the semiconductor arrangement is opened again and an electric current can then flow between the two terminals through the channel region.

A power MOSFET, preferably of the normally-off type, or even a MESFET (Metal Semiconductor Field Effect Transistor) is proposed as silicon component. The semiconductor arrangement is preferably embodied as a vertical JFET (junction Field Effect Transistor). The source of the JFET is short circuited to the drain of the silicon MOSFET. The drain of the JFET is electrically connected to the second terminal of the electronic switching device. The gate of the JFET is electrically short circuited to the first terminal of the electronic switching device and of the source of the silicon MOSFET. With such a known electronic device, which can be referred to as a hybrid power MOSFET or cascode circuit, it is possible to reach, in particular, off-state voltages of up to 5000 V and on-state currents between 5 A and 5000 A if silicon carbide (SiC) is used as the semiconductor material for the semiconductor arrangement. If a semiconductor arrangement of an IGBT-like hybrid based on silicon carbide (SiC) is combined with a silicon MOSFET in a further embodiment of the electronic device known from DE 196 10 135 C1, off-state voltages of up to 10,000 V and rated currents up to 100 A/chip can be reached.

The further publication DE 198 33 214 C1 discloses a JFET semiconductor arrangement which is constructed as a mesa structure with epitaxial layers and is preferably based on silicon carbide (SiC) as switching element. This high blocking capacity JFET semiconductor arrangement is proposed in particular for converter applications for drives of a variable rotation speed or as a.c. voltage switches of motor branches in which the switching components have to be operated in the normally-off state, i.e. are to automatically go into the off state when the current is removed. In this respect, it is proposed to connect the high blocking capacity JFET semiconductor arrangement in a cascode circuit with a low voltage MOSFET or low voltage Smart MOSFET, it being possible to manufacture the low voltage FET using known silicon technology.

Self-protection of the switching device is provided only to a limited degree without additional electronics with a secondary energy supply both in the case of the cascode circuit known from DE 196 10 135 C1 and also that described in DE 198 33 214 C1. Although significantly longer overcurrent or short circuit times may be permitted in comparison with conventional semiconductor switching elements based on silicon, the power loss in the semiconductor arrangement (the JFET) of the cascode circuit which is taken up when there is an overload or a short circuit over a relatively long time leads to thermal destruction of the protection element, and thus of the switching element, after a number of power system periods (in the case of a.c. voltage) or generally after the overload current or short circuit current has been applied for some time.

It is true that DE 196 10 135 C1 proposes to replace the silicon power MOSFET with what is referred to as a Smart power silicon MOSFET or a corresponding intelligent silicon component for switching purposes, in order to equip the electronic device with both switching functions and protection functions, for example overvoltage protection or overcurrent deactivation. However, DE 196 101 135 C1 does not give any specific information on how the connections in the Smart power silicon MOSFET have to be in order to implement the abovementioned protection functions, in particular the overcurrent deactivation, in particular as the saturation current of the JFET is in the normal ohmic operating range of the silicon MOSFET and is therefore not a detectable overcurrent for the MOSFET.

The further document DE 34 45 340 A1 discloses a single-direction or two-direction switch which is connected into a line branch a power system voltage of 220 V and 50 Hz in series with a load. In the embodiment as a single-direction switch, the switch comprises a MOSFET and a resistor (R1) which is connected in series with it and in an embodiment as a two-direction switch it comprises two MOSFETs which are connected in an anti serial configuration with a resistor (R1) connected between the two FETs. The voltage which drops across the resistor (R1) is tapped by a current limiting circuit with a further resistor and a bipolar transistor in the case of the single-direction switch and with two resistors and two bipolar transistors in the case of the two-direction switch. The current limiting circuit is connected to the gate of each MOSFET and reduces the control voltage—present between the gate and source—at the MOSFET if the voltage drop at the resistor (R1) becomes higher than 0.6 V. The current limiting circuit regulates the current through the resistor (R1) and thus through the entire switch to a value in the equilibrium state which brings about a voltage drop which corresponds to the base-emitter voltage of the bipolar transistors of the current limiting circuit. However, owing to the resistor (R1)—always connected in series—of the current limiting circuit, this known switch also has high electrical losses in the rated operating mode. The current limitation is carried out by way of the MOSFET switching elements themselves, their electrical resistance being controlled by way of the change in the gate voltage by the current limiting circuit.

The switch according to DE 34 45 340 A1 also has a short circuit protection in that two additional transistors (FET3 and FET4) are provided. One FET (FET4) forms a control switch which is connected together with a resistor (R5) between the two poles of the control voltage. The gate of this control switch FET is connected to the source of the other FET (FET3). The drain of this other FET is in turn connected via a diode (Da) to a pole of the power system voltage while its gate is connected to the positive pole of the control voltage. If the load is short circuited, the current in the switched on state rises to the limited value. When the latter is reached, the instantaneous a.c. voltage appears at the drain of the second FET (FET3) via the diode Da. The gate voltage at the FET3 is positive when the circuit is driven. The voltage level at the source of FET3 is equal to that of the gate of FET4 and is also positive so that the FET4 conducts. This has the effect of the control voltage at the gate or gates of the MOSFETs being reduced to a critical value below the thermal gate-source voltage, and the switch switches off.

However, this known circuit is in great danger in the event of a short circuit as the MOSFET (FET1) withstands short circuit currents thermally only for a few microseconds and is then destroyed and the deactivation device which is formed by the two transistors FET3 and FET4 cannot ensure such rapid deactivation. According to DE 34 45 340 A1, the intention is that both the current limitation and the short circuit protection function are to function without extraneous energy when the MOSFET switches off. However, the tapping of the voltage drop at the switching element in order to deactivate the switching element itself is not practicable as the MOSFET has to be configured with the smallest possible on-state resistance in order to minimize switching losses, and is therefore subject to considerable thermal loads until the overvoltage required for deactivation in the event of a short circuit is reached. This known switch is therefore not intrinsically safe.

The document WO 94/11937 A1 discloses a working circuit with a FET as electronic switching element and a temperature-dependent resistor, connected in series, as electronic protection element for protecting the switching element against excessively high Joule losses in the event of danger, in particular in an overload situation or short circuit situation. Owing to the associated heating occurring in the event of danger, the protection element bears the predominant part of the operating voltage dropping across the working circuit composed of the switching element and protection element. Switching off elements are also disclosed which, in the event of danger, automatically change the switching element into the switched off state using the energy contained in the operating current and the operating voltage if the operating current flowing through the working circuit or the voltage dropping across the working circuit or the protection element exceeds a predefined upper limiting value. These switching off device(s) include a circuit of a bipolar transistor which is connected to the gate of the FET switching element in order to switch it on or off, together with diodes and resistors as voltage divider.

WO 00/24105 A1 discloses a circuit with a PTC resistor in series with a MOSFET switching element or a JFET switching element. The PTC resistor is used as a protection element for the switching element in the event of danger. A transistor, together with a voltage divider, switches the MOSFET switching element off if the voltage across the PTC resistor exceeds a certain value, that is to say in the case of an error current or short circuit current. These switching off device(s) also operate automatically, that is to say without auxiliary energy.

SUMMARY OF THE INVENTION

The invention, in one embodiment, is based on an object of specifying an electronic switching device and a method for operating a switching device in which reliable self-protection of the switching device is provided even without supplying secondary energy.

This object may be achieved according to an embodiment of the invention, by way of a switching device and a method for operating a switching device.

An embodiment of the invention is based on a switching device having a working circuit (operating circuit) including at least one electronic and at least one electronic protection element which is generally electrically connected in series with the switching element. An operating voltage can be applied or is applied to the working circuit. The switching element can be switched to and fro between a switched off state and a switched on state by way of a switching signal which can be applied to at least one control terminal. The protection element protects the switching element in the switched on state, that is to say if an operating current flows through the circuit composed of the protection element and the switching element, against excessive thermal loading in the event of danger, in particular in an overload situation or in a short circuit situation, in which significantly higher currents flow through the working circuit than during normal operation (rated operation) or would flow as prospective currents and would thermally endanger the switching element as a result of the resulting Joule waste heat. For this purpose, the protection element bears (or absorbs or takes up) the major or significant part of the operating voltage (voltage drop) when the switching element is switched on in the event of danger and thus also correspondingly absorbs the major part of the Joule waste power occurring in the working circuit in the event of danger. The protection element is of correspondingly robust design. A specific circuit and embodiment with these properties is known per se from DE 196 101 35 C1 mentioned at the beginning.

An embodiment of the invention may be based on the first idea of switching off the switching element in the event of danger when a deactivation or switch-off criterion, wherein a critical current value or voltage value (or upper limiting value, threshold value, maximum value) being exceeded, is fulfilled. It may thus be based on eliminating the overvoltage which drops across the protection element and the excessively high thermal energy. For the purpose of switching off, the operating current which flows through the working circuit or the operating voltage which drops across the entire working circuit or the protection element, and a corresponding associated upper limiting value, are used.

An embodiment of the invention may also be based on the second idea that the energy required for deactivating the switching element is not drawn from an external extraneous or secondary energy source, but rather directly from the electrical operating energy which is available at the working circuit. In the event of danger, the switching element is thus switched off completely autonomously according to an embodiment of the invention and cannot be endangered by the continued presence of secondary energy. The electronic switching device and the method for operating a switching device according to the invention are thus completely self-protected. The switching device which is configured or operated according to an embodiment of the invention thus has the flexibility of electronic switching units and at the same time a robustness which is comparable to mechanical switchgear.

In the case of an overload or short circuit, the switching element is then switched off by way of the switching off device(s), and the current flow through the switching device is thus limited to a noncritical value. However, the operating current drops after the switching element is switched off, and the operating voltage dropping across the circuit composed of the switching element and protection element is thus reduced again to a value below the associated critical upper limiting value. The control variable for the switching off device(s), in particular the control switch, is thus back in the noncritical range outside the range of the dangerous situation.

An embodiment of the invention may be based on the third idea that, in the event of danger, the switching off device(s) automatically maintain the switched off state of the switching element at least for a specific time period (minimum time interval) after the switching element has been switched off, and in particular they therefore no longer require any further energy from the operating voltage or the operating current after the single deactivation process.

In the event of danger, the switching off device(s) switch the switching element off and subsequently keep the switching element in the switched off state only for a predefined time interval. During this time interval, the control signal which is supplied by the switching off device(s) is then independent of the currently occurring operating voltage or the operating current and corresponds to the switching off switching signal for the switching element. The switching off device(s) thus maintain the switched off state of the switching element for the predefined minimum time interval even if the dangerous situation is no longer occurring. On the other hand, after the time interval has expired, the switching signal of the switching off device(s) is dependent again on the currently occurring operating voltage or the operating current and goes into the switching off mode again only when a dangerous situation occurs. The switching element can thus be freely switched again in the rated operating mode.

As a rule, the operating voltage, and thus the operating current, are a variable that changes over time, and usually also changes (alternates) in polarity, for example a periodically alternating voltage or current (a.c. voltage or a.c. current) such as is customarily made available by electrical power supply systems or electrical generators. Such an alternating voltage or alternating current ideally has a sinusoidal time profile.

The selection of an alternating operating voltage then has the effect that in the event of an overload or short circuit the overload or short circuit current also changes polarity, in particular oscillates with the period of the operating voltage. If the operating current is therefore reduced or entirely switched off by the switching off device(s) when the limiting value is exceeded in a half period (half wave), the switching element is switched back into the conductive state (switched on) by the feeding back to the driving of the switching off device(s). The circuit with the switching element and protection element is therefore loaded electrically and thermally by the power loss at every half wave at current values or voltage values which are below the limiting value.

This switching on of the switching element again during one phase of a polarity, in particular a half period (half wave), of the alternating operating voltage is prevented according to an embodiment of the invention by the already described maintenance of the switched off state of the switching element for a predefined minimum time period.

The minimum time period during which the switching element is maintained in the off state (nonconductive state) by the switching off device(s) is for this purpose selected, according to a fourth idea of the invention, to be at least as long as half the period length of the operating a.c. voltage so that no further losses, or only small further losses, are permitted in the same half period in which the dangerous situation occurred. The minimum time period for the deactivation of the switching element is preferably selected to be at least as long as the full period length of the operating a.c. voltage in order also to span the half period with the opposite polarity of the operating a.c. voltage.

In a first embodiment, the switching off device(s) of the switching device have at least three terminals, two of which are inputs and one an output. The two inputs are connected to the working circuit with switching element and protection element in such a way that the operating voltage itself or a part of the operating voltage which drops across or in the circuit with switching element and protection element or the operating current which flows through the circuit or a part thereof which is branched off can be tapped or is tapped at or between the inputs. From this electrical variable, voltage or current which is tapped at the inputs, the switching off device(s) then form a switching signal which is made available at the output and can thus be applied, or is applied, to the control terminal of the switching element. The switching signal of the switching off device(s) leaves the state of the switching element unaffected during normal operation as long as the dangerous situation does not occur. However, if the dangerous situation occurs, the switching off device(s) change the switching signal at the output using the electrical energy present in the operating voltage or operating current, and switch the switching element off using the changed switching signal, and therefore switch the switching element into the off state or currentless state.

One particularly advantageous embodiment of the switching device is defined in that the switching off device(s) include a control switch for switching off the switching element. The control switch is then switched between the control terminal of the switching element and a switching point to which a signal is applied which switches off the switching element when the control switch is connected through to the control terminal of the switching element, that is to say said signal corresponds to a switching off signal. This signal which is applied to the switching point may in particular be an essentially constant electrical potential, preferably ground potential or frame potential. A control signal, which is generated from the operating voltage or the operating current, is applied to a control terminal of the control switch. The control signal switches the control switch on, and therefore switches it into its on state or switched on state if the dangerous situation occurs. Conversely, that is to say if the dangerous situation does not occur, the control switch is switched off, that is to say switched into its off state or switched off state, by way of a correspondingly changed control signal.

This then results in a situation in which, during rated operation (i.e. normal operation, not a dangerous situation), the switching off signal, in particular the constant potential, at the switching point located on the other side of the control switch decouples from the control terminal of the switching element as a result of the control switch and is therefore not effective for controlling the switching element. On the other hand, in a dangerous situation, the control switch connects through the switching off signal at the switching point to the control terminal of the switching element, if appropriate by way of further circuit modules. The connected-through control potential or switching signal of the switching point then causes the switching element to change into its off state. The switching off signal then keeps the switching element closed (switched off) in the dangerous situation irrespective of how far the current value of the operating voltage or of the operating current is or was above the upper limiting value.

As, in most cases, the control signal for the control switch will lie below the operating voltage at the operating circuit, in one preferred development the operating voltage is divided down by a voltage divider and a divided voltage which is obtained or a current which is derived there from is used as the switching signal. The voltage divider is then a component of the switching off device(s).

The operating current can likewise also be divided down in that a tapping resistor is connected into the current path for the operating current or for a branched off current (component current, monitoring current) which has a uniquely defined relationship with the operating current, and generate the switching signal, if appropriate again with intermediate connection of a voltage divider, from the tapping voltage which is tapped at the tapping resistor.

A decoupling resistor is preferably connected to the switching off signal in series with the control switch between the control terminal of the switching element and the switching point. This decoupling resistor is in particular part of a voltage divider for dividing the operating voltage or the tapping voltage.

In one particularly advantageous embodiment, the control switch of the switching off device(s) includes at least one control transistor. The control transistor is preferably a MISFET (Metal Insulator Semiconductor Field Effect Transistor), in particular a MOSFET. The switching signal is then in particular a control potential or a control voltage between the gate and source. It is particularly advantageous to use a normally-off MISFET or MOSFET (enrichment type). Such a normally-off MISFET is in the normally off (switched off) state at a control voltage of 0 V or below a threshold voltage and, in order to switch on or change into the on state, it requires an active switching voltage or control voltage which is higher than 0 V in absolute terms, and must generally lie above the threshold voltage. In order to maintain the switched on state of such a normally-off MISFET, a certain minimum amount of energy is therefore always necessary owing to the losses which can never be entirely avoided. In a dangerous situation, this energy is drawn from the operating voltage or the operating current. If the dangerous situation is no longer occurring, the normally-off MISFET is switched off again. The normally-off MISFET thus permits the switched state of the switching element to be automatically reset back into the switched on state or switchable state for the rated operation.

However, the control transistor may also be a bipolar (current-controlled) transistor (of the npn type or pnp type) or a (voltage-controlled) IGBT (Insulated Gate Bipolar Transistor). In addition, a different component which is capable of switching or a semiconductor component may be used as the control switch, for example a thyristor or an MCT (MOS Controlled Thyristor).

If, in one advantageous application, the switching device is connected into a line branch of an electrical supply power system, in particular a low voltage power system (typically between 230 V and 690 V as an effective value of the operating voltage in the rated mode) upstream of an electrical load, the switching device also disconnects the load in good time from the power system in the case of an overload or short circuit, and thus prevents damage to the load.

The switching off device(s) can also be deactivated as soon as the dangerous situation no longer occurs. The switching off device(s) then immediately stop generating the switching off signal at the control terminal of the switching element after the operating voltage or the operating current has dropped below the upper limiting value again.

The fact that the switched off state of the switching element is maintained even after the dangerous situation has (temporarily) ended may, in one subvariant, be permanent and independent of the rest of the course of the operating voltage or of the operating current, for example as a result of a mechanical switch being selected as the control switch. In this embodiment, an additional secondary energy terminal will then preferably be necessary for switching on (not for deactivating) the switching element again, or a particular intervention in the switching off device(s) will preferably be necessary, so that the switching element becomes freely switchable again after a dangerous situation has been eliminated. However, this embodiment is not very suitable for practical applications.

In one advantageous embodiment, the switching off device(s) include, for the purpose of maintaining the switched off state of the switching element or the corresponding switching off switching signal for the switching element, at least one capacitor which is preferably connected between the control terminal of the control switch and the associated switching point (with the switching off signal). The capacitor stores the charges which are obtained from the operating current and as a result maintains a voltage at its two capacitor plates. This capacitor voltage is preferably suitably connected by way of a Zener diode which is connected in parallel with the capacitor. The Zener diode is connected in particular between the control terminal of the control switch and the associated switching point and is used to set the control voltage even if there is no capacitor present. In one preferred development, a discharging resistor is connected in parallel with the capacitor. The minimum time interval for maintaining the switching off signal at the control terminal of the switching element is then determined by the discharge time (time constant) of the parallel circuit formed from the capacitor and discharging resistor.

In order to implement a switching device which can switch operating voltages with alternating polarity, in particular (periodic) a.c. voltages, in a intrinsically safe fashion, two generally identical circuits which are each composed of a switching element and a protection element are connected in an antiserial configuration into the current path and are each provided with associated deactivation device(s). In addition, in order to protect the working circuit when the polarity of the operating voltage is reversed, it is also possible to provide protection device(s) such as for example a protection diode which is connected in parallel.

The working circuit which is composed of the switching element and protection element generally has a first terminal and a second terminal. The operating voltage is then to be applied to the two terminals. A first terminal of the two terminals of the working circuit is then advantageously connected to the switching point assigned to the control switch, and is preferably at the same electrical potential as this switching point. The active phase of the operating voltage is consequently applied to the other, second terminal.

The control terminal of the control switch can then be connected to the second terminal for the operating voltage. The switching off device(s) then preferably comprise an additional voltage-proof switch, for example also a MISFET or MOSFET, between the control switch and the second terminal in order to be able to deactivate the switching off device(s) when necessary and avoid additional losses in the switching off device(s) if the switching element is in the switched off state.

For the rated operating mode of the switching device, control device(s) are generally provided which are connected, or can be connected, to the control terminal of the switching element, in particular via an input resistor, and which, in the rated operating mode, apply a switching signal to the control terminal of the switching element in order to switch it on and off. The competition which then initially exists between the driving of the switching element by the control device(s) on the one hand and the switching off device(s) on the other is preferably resolved such that the control device(s) determine the switching state of the switching element if the dangerous situation does not occur, and the switching off device(s) determine the switched state of the switching element if the dangerous situation occurs. For this purpose, the control device(s) and the switching off device(s) preferably respectively activate and/or deactivate one another in the respective situation.

Activation of the switching off device(s) by the control device(s) can be implemented in such a way that a control terminal of the voltage-proof switch is connected to the control device(s) and the control device(s) switch on the voltage-proof switch. As a result, the voltage-proof switch connects through and the control signal at the switching terminal of the control switch is connected to the operating voltage or operating current at or in the working circuit.

In one particularly advantageous embodiment, the control-device(s) switch on the voltage-proof switch connects together (simultaneously, synchronously) with the switching element. As a result, the switching off device(s) are activated by the control device(s) only if the switching element is in the switched on state. On the other hand, if the switching element has already been switched off by the control-device(s), the switching off device(s) must not be activated any more and the losses caused by the additional connection of the switching off device(s) can be avoided.

In order to avoid negative driving during the opposite polarity of the operating a.c. voltage, it is possible for a diode to be additionally connected between the control terminal of the control switch and the second terminal for the operating voltage. In addition, an intermediate resistor is also preferably connected between the control terminal of the control switch and the second terminal for the operating voltage in order to set the signal level at the switching terminal of the control switch.

In one preferred embodiment, the switching element includes a particular field effect transistor which is derived from a MISFET, is known under the trade name HITFET and comprises an additional current monitor output. The switching off device(s) then tap the operating current, or a current signal which is dependent on the operating current in a uniquely defined way, at the current monitor output of the HITFET in order to generate the switching signal which is applied, or can be applied, to the control terminal of the HITFET, preferably via a tapping resistor.

In all the embodiments, the electronic protection element is formed on the basis of at least one semiconductor which has a breakdown field strength of at least $10^6$ V/cm and/or an energy gap of at least 2 eV and is thus suitable for switching off relatively high voltages. As a result, the protection element can carry a particularly high proportion of the operating voltage in the event of danger. Suitable semiconductor materials are silicon carbide (SiC), in particular of the β-polytype (3C) or of an α-polytype, for example 15R, 4H or 6H polytype, gallium nitride (GaN), diamond, aluminum nitride (AlN) and indium nitride (InN). The preferred semiconductor material is silicon carbide (SiC) owing to its high breakdown strength, low power loss, high temperature resistance, chemical resistance and high thermal conductivity.

On the other hand, for the switching element the significant factor is to have the best possible switching behavior, and the dielectric strength is less significant and is largely performed via the protection element. The electronic switching element is therefore preferably constructed on the basis of one or more semiconductors made of the group of semiconductors comprising silicon (Si), gallium arsenide (GaAs) and germanium (Ge).

Although the protection element should now take up a large proportion (as large as possible) of the operating voltage dropping across the working circuit and correspondingly the Joule losses, for example, at least 70% and preferably at least 90%, in the event of danger, conversely it should have the lowest possible on state losses in the normal operating mode (rated operating mode), that is to say when there is a load which is operated normally without an overload or short circuit and when the rated currents are thus significantly lower. The ratio between the voltage dropping across the protection element and the voltage dropping across the switching element, and thus also the ratio between the Joule power loss which is released in the protection element and the Joule power loss which is released in the switching element, must be significantly lower in the rated operating mode than in the event of danger.

For this reason, the proportion of the voltage drop, and thus of the Joule thermal output, which is absorbed by the protection element preferably increases to a correspondingly high degree in the event of danger in comparison with the rated operating mode. The absolute value of the part of the operating voltage which drops across the switching element can then also be held below a predefined maximum value, for example 100 V or even 50 V. Such a voltage take-up at the protection element which, in the event of danger, rises in relation to the voltage take-up at the switching element can be achieved with a correspondingly current-limiting component.

A component which exhibits a saturation behavior and in which therefore the current approaches a saturation current, or assumes it, as the voltage rises in the on state range in the current/voltage characteristic curve is particularly suitable. The upper limiting value for the voltage or current which is decisive for the occurrence of the dangerous situation, or defines it, in the working circuit is preferably within the range in which the protection element becomes, or has become, saturated. The protection element has a very flat current/voltage characteristic curve in its saturation. The sensitivity during the sensing of voltage is then significantly greater than when sensing current so that the monitoring of the voltage drop by way of the protection element or the working circuit with a protection element and switching element is particularly effective here. The saturation current of the protection element is preferably smaller, for example by a factor of at least 2 or even at least 3, than the thermal limiting current of the switching element. The thermal limiting current is the maximum permissible current at which thermal destruction does not yet take place.

The protection element can bear the applied off state voltage via at least a p-n type junction operated in the off state direction and/or at least a Schottky junction in which in each case the formation of depletion zones for switching off the voltage is characteristic.

Preferred component structures for the protection element and/or the switching element are JFET (Junction Field Effect Transistor), MESFET (Metal Semiconductor Field Effect Transistor) and/or MISFET, in particular MOSFET, structures.

In one particularly advantageous combination, the protection element is equipped with a JFET structure or a MESFET structure and the switching element is equipped with a MISFET structure. In the working circuit which can be referred to as a cascode circuit, the gate terminal of the JFET structure or MESFET structure of the protection element is then connected to the source terminal of the MISFET structure of the switching element, and the source terminal of the JFET structure or MESFET structure of the protection element is connected to the drain terminal of the MISFET structure of the switching element.

In one advantageous application, the switching device is connected into a line branch, in particular a line branch of an electrical power supply system, upstream of an electrical load.

BRIEF DESCRIPTION OF THE DRAWINGS

In order to explain the invention further, reference is made to the drawings, in which.

DETAILED DESCRIPTION OF THE PREFERRED EMBODIMENTS

Figure 1:
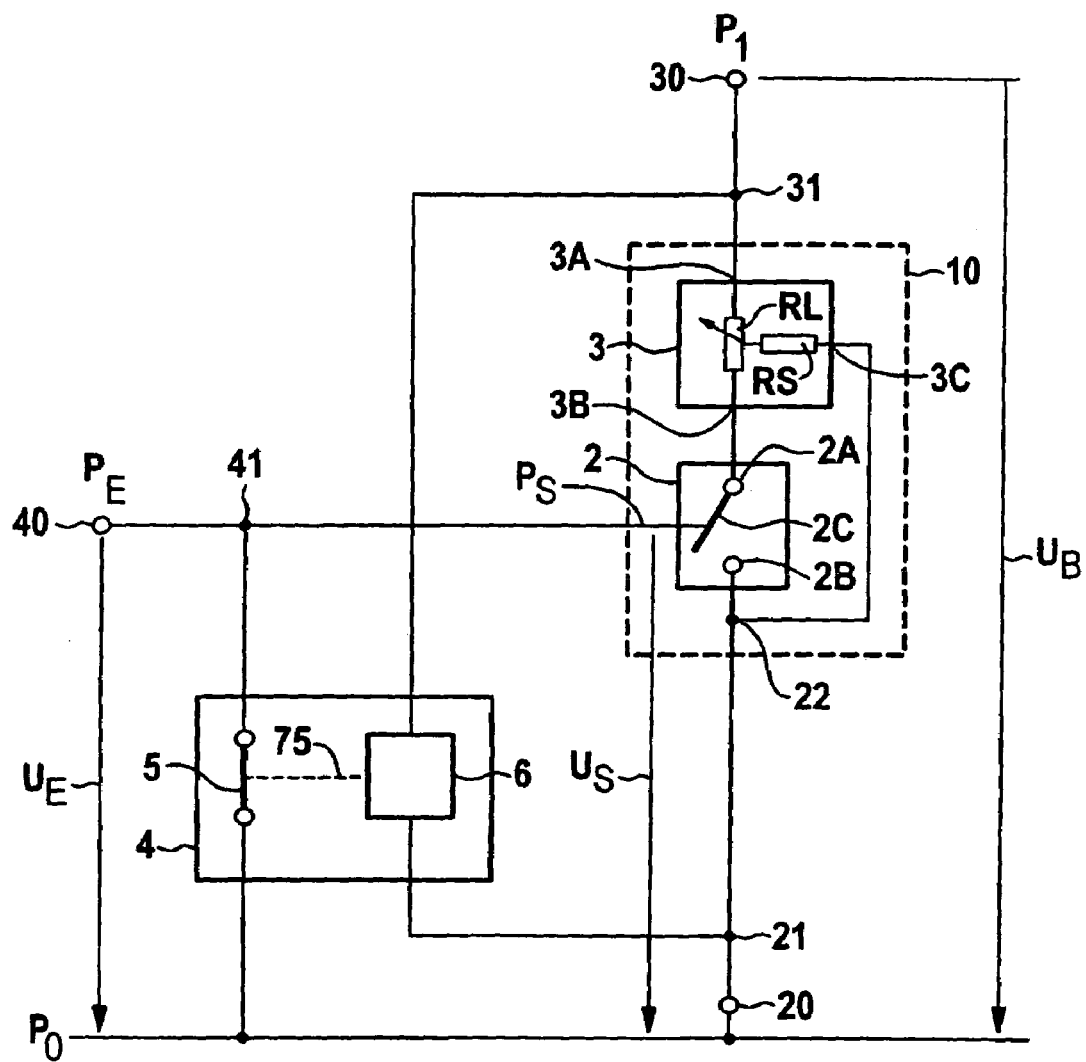
FIG. 1 shows an embodiment of a switching device with voltage-dependent deactivation in a basic outline.
Figure 2:
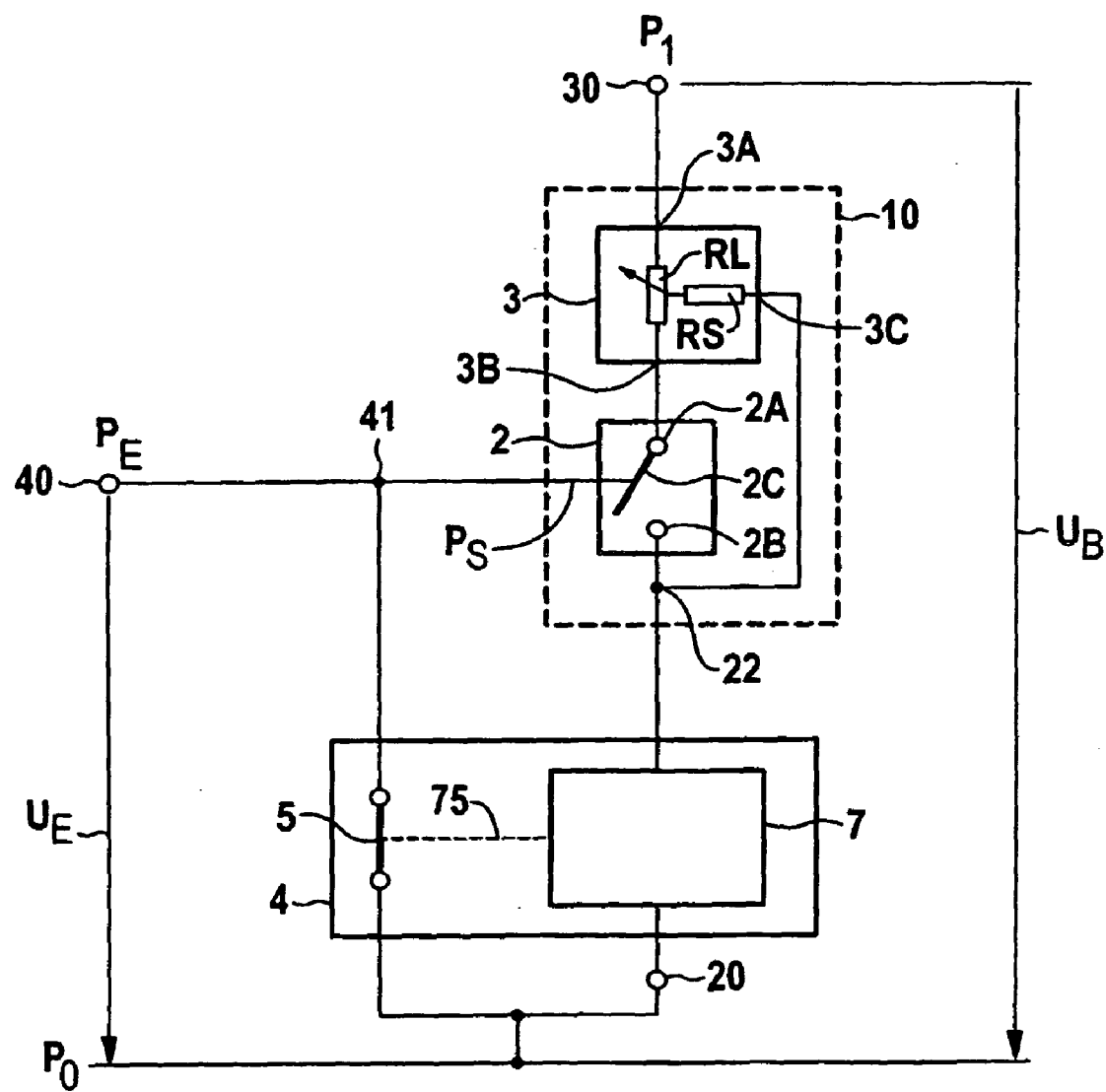
FIG. 2 shows an embodiment of a switching device with current-dependent deactivation in a basic outline.

The switching devices according to FIGS. 1 and 2 each include a working circuit 10 including an electronic switching element 2 with three electrical terminals (contacts, electrodes) 2A, 2B and 2C and an electronic protection element 3 with three electrical terminals 3A, 3B and 3C. The entire working circuit 10 is connected between two electrical terminals 20 and 30 between which an operating voltage $U_B$ is applied or can be applied. The first terminal 20 is at a potential $P_0$ here, and the second terminal at a potential $P_1$. The potential $P_0$ is generally essentially constant, in particular earth potential or frame potential, while the potential $P_1$ corresponds to the active phase. The switching element 2 and the protection element 3 are electrically connected in series into a current path between the two terminals 20 and 30 by connecting the terminal 2B of the switching element 2 to the terminal 20, the terminal 2A of the switching element 2 to the terminal 3B of the protection element 3, and the terminal 3A of the protection element 3 to the terminal 30.

In addition, the protection element 3 is connected, by way of the third terminal 3C of the protection element 3, into a second current path running parallel to the first current path, between the terminals 20 and 30, by connecting the terminal 3C via a switching point 22 to the terminal 2B of the switching element 2.

The electronic switching element 2 is represented by a switch symbol and can be switched to and fro by use of a switching signal, applied to the control terminal 2C, between an on state (switched on state, conductive state, state with low on state resistance) and an off state (switched off state, nonconductive state, state with very high on state resistance). In the on state, it is possible for an electric current (on state current) to flow through the switching element 2 between the two terminals 2A and 2B. On the other hand, in the off state, only a virtually negligible off current then flows. The switching signal $P_S$ which corresponds to the on state of the switching element is also referred to below as the switching on switching signal, and the switching signal $P_S$ corresponding to the off state of the switching element is also referred to as the switching off switching signal. The switching signal $P_S$ is, depending on the component of the switching element 2, an electrical control potential or else an electrical control current, but can also be an optical signal when there is optical actuation. The switching element 2 is generally a semiconductor component based on silicon (Si), in particular a MOSFET, MESFET, thyristor, IGBT or MCT.

The protection element 3 has the function of protecting the switching element 2 against excessively high voltages and currents. In particular, the protection element 3 has to relieve the switching element 2 of loading both in its on state and in its off state at least predominantly with respect to the applied operating voltage $U_B$ so that the switching element has to be configured only for a predefined maximum off state voltage which is significantly lower than the maximum operating voltage. In the on state of the switching element 2, the protection element 3 is to have the lowest possible on state losses, that is to say the lowest possible electrical resistance, in the rated operating mode. Furthermore, in the on state of the switching element 2, the protection element 3 is also to limit the overload currents flowing through the working circuit 10, said currents being usually at least three times the rated currents, or to limit the short circuit currents which rise to a significantly higher level, with the result that the switching element 2 is not exposed by these excessively high currents to high power losses and thus to the risk of thermal destruction.

Therefore, in the case of overload currents and even also in the case of short circuit currents, the electrical resistance in the protection element 3 must be significantly higher than in the case of rated currents so that the protection element 3 can effectively limit the high currents. This in turn indicates that the protection element 3 absorbs appropriately large voltage drops in the case of an overload or short circuit. The implementation of these functions of the protection element 3 in terms of circuitry is indicated by a controllable resistor $R_L$ in series with the switching element 2 and a very high resistance $R_S$ (or even a capacitance) in parallel with the switching element 2. If the characteristic curves of the protection element and switching element are in the ohmic range, the ratio of the voltage drops at the two elements also corresponds to the ratio of their respective electrical resistances. The ratio formed from the part of the operating voltage which drops across the protection element and the part of the operating voltage which drops across the switching element in the switched on state of the switching element, that is to say when the current is flowing, is generally greater than 7:3, in particular greater than 9:1 and preferably even greater than 10:1, in the case of danger.

In practice, a semiconductor component can be used as a protection element 3 which is in a saturated state in the case of overload currents or at the latest in the case of short circuit currents, that is to say is in a region of the characteristic curve with a current which virtually no longer increases as the voltage increases, and thus with a very high electrical resistance, and in the rated operating mode said protection element 3 is generally in an ohmic region of the characteristic curve with low resistance. Examples of such components are field effect transistors, in particular JFETs, MESFETs and MOSFETs, or IGBTs.

Owing to its aforesaid properties, the protection element 3 is made more voltage-proof than the switching element 2 and, for this purpose, is preferably formed with a semiconductor material with a high energy gap of at least 2 eV or a high breakdown field strength of at least 1,000,000 V/cm. The preferred semiconductor material for the protection element 3 is (generally monocrystalline) silicon carbide (SiC), in particular of one or a plurality of predefined polytypes such as the β-polytype (3C polytype) or a, for example, α-polytype (4H, 6H or 15R polytype).

If a switching on switching signal $P_S$ is applied to the control terminal 2C of the switching element 2, the switching element 2 and the protection element 3 are each in the on state so that an operating current can flow through the working circuit 10. This operating current is in the rated current range in the fault-free operating mode during normal load. The protection element 3 is not in the saturated state.

In the case of an overload or a short circuit, the protection element 3 then goes into the saturated state and limits the current to the saturation current. If this case of overloading or short circuiting continues for a relatively long time, considerable heat loss (Joule heat) occurs in the protection element 3 and this can also damage or destroy the protection element 3 which is robust per se.

For this reason, according to an embodiment of the invention, switching off device(s) (switching off device) 4 are provided which switch off the switching element 2 in a case of danger such as overloading or short circuiting and as a result limit the current flow through the series circuit 10 to the off state current. As a result, the protection element 3 is relieved of loading again.

Figure 3:
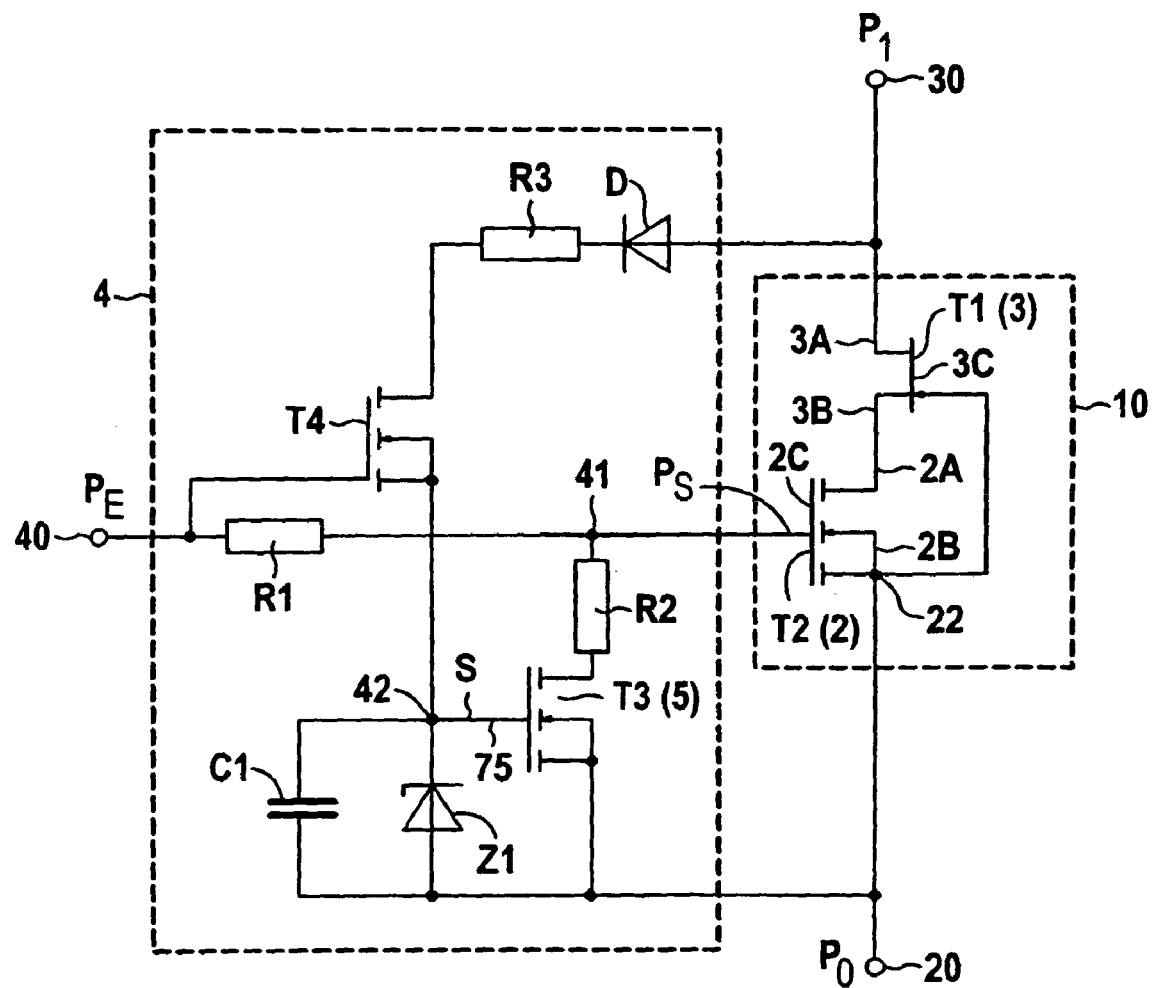
FIG. 3 shows a specific embodiment of a switching device with voltage-dependent deactivation by way of a transistor circuit.

FIG. 3 shows a specific embodiment of the working circuit 10 which is embodied as a cascode circuit composed of a JFET which is designated by T1 as a protection element 3, and a MOSFET which is designated by T2 as a switching element 2. This cascode circuit is known per se and is described, for example, in DE 196 10 135 C1. As well as in this document DE 196 10 135 C1, exemplary embodiments of the JFET T1 as protection element 3 are also described in DE 198 33 214 C1. The disclosed contents of the two documents DE 196 10 135 C1 and DE 198 33 214 C1 are also hereby incorporated in the content of the present application, in their entirety, by reference.

The JFET T1 is formed on the basis of silicon carbide (SiC), and the MOSFET T2 on the basis of silicon (Si). The source 2B of the MOSFET T2 is connected to the terminal 20, the drain 2A of the MOSFET to the source 3B of the JFET T1, the source 3A of the JFET T1 to the terminal 30, the gate 3C of the JFET T1 to the source 2B of the MOSFET T2 and to the terminal 20. In order to switch the MOSFET T2, a control potential $P_S$ is applied to its gate 2C. The gate source voltage of the MOSFET T2 is the corresponding control voltage $U_S = P_S - P_0$. This control potential $P_S$ corresponds in the rated operating mode to the input potential $P_E$ which is applied via an input resistor R1 (or corresponds to the input voltage $U_E = P_E - P_0$ at a control input 40. The MOSFET T2 is of the normally-off type so that, when there is a control voltage $U_S = 0$ V, the MOSFET T2 is in the switched off state and the MOSFET T2 is powered up, and goes into its conductive or switched on state, only when there is a control voltage $U_S$ which is greater than a specific threshold value.

The behavior of the protection element 3, that is to say of the JFET T1, when an operating forward state voltage is applied is dependent on the electrical operating current flowing through the JFET T1. When a specific critical current value (saturation current) is reached, the JFET T1 goes into the saturated state as a result of the channel region being choked off, and reduces the current below the saturation current value while the voltage remains constant or even rises further.

If, in the event of danger, for example in an overload or short circuit situation, the voltage at the JFET T1 then rises further after the current has already reached the saturation current value, the electrical power loss at the JFET T1 rises and the JFET T1 heats up further. As the internal temperature rises, the mobility of those charge carriers which flow through the channel region of the JFET T1 decreases. Owing to this feedback effect, the JFET T1 also limits a strongly increasing electrical current quickly to a noncritical current value (limiting current) as in a short circuit situation, said noncritical current value being significantly below the saturation current in the cold state. However, the JFET T1 can maintain this limiting of the overload current or short circuit current only for a specific time period owing to the high power loss. In the case of short circuit currents which persist over a plurality of voltage periods, the working circuit 10 is therefore not reliably intrinsically safe.

In the event of danger, a specific additional circuit is therefore provided as switching off device(s) 4. This additional circuit of the switching off device(s) 4 is connected in parallel with the working circuit 10 between the two terminals 20 and 30.

The switching off device(s) 4 include a control transistor T3 as control switch 5. The control transistor T3 is also a normally-off MOSFET, in particular a commercially available silicon MOSFET. The source of the control transistor T3 is connected to the terminal 20. The drain of the control transistor T3 is connected via a decoupling resistor R2 to a switching point 41 which is located between the input resistor R1 for the input potential PE and the gate 2C of the MOSFET T2. A parallel circuit composed of a Zener diode Z1 and a capacitor C1 is connected between the source of the control transistor T3 and the gate of the control transistor T3. The gate of the control transistor T3, the Zener diode Z1 and the capacitor C1 are connected in a star shape to a switching point 42 to which a further voltage-proof transistor T4, which is preferably again embodied as a normally-off MOSFET, is additionally connected by its source in a star shape. Between the drain of this transistor T4 and the second terminal 30 of the working circuit 10, a series circuit including an intermediate resistor R3 and a diode D is connected. In addition, the input potential $P_E$ of the control input 40 is connected directly to the gate of the transistor T4.

The signal level of the control signal S which is applied to the gate of the control transistor T3 is then dependent on the operating voltage applied between the terminals 20 and 30. A threshold voltage or a limiting value for the control signal S, which clearly corresponds to a specific limiting value of the operating voltage between the terminals 20 and 30, is defined by the selection of the resistance value of the intermediate resistor R3 and the Zener voltage of the Zener diode Z1. As long as the operating voltage remains below its limiting value, the control transistor T3 remains in its off state and the switching signal $P_S$ at the gate 2C of the MOSFET T2 is determined by the input potential PE at the control input 40. In this rated operating situation, the switching element 2, and thus the working circuit 10, can therefore be switched on or off in a desired way via the control input 40.

However, if the operating voltage between the terminals 20 and 30 exceeds the predefined limiting value in the event of danger, the control signal S at the gate of the control transistor T3 assumes a value which lies above its threshold voltage and the control transistor T3 is connected through. As a result, the gate 2C of the MOSFET T2 is connected via the switching point 41, the decoupling resistor R2 and the connected-through control transistor T3 to the terminal 20 which is at the potential $P_0$ (source potential). The control voltage $U_S$ at the gate 2C of the MOSFET T2 is thus reduced to a value below the threshold voltage so that the MOSFET T2 is switched off. As a result, the entire working circuit 10 goes into the off, nonconductive state.

As a result, when an overload or short circuit situation occurs, the cascode circuit or working circuit 10 is switched off automatically by way of the switching off device(s) 4. The resistors R1 and R2 are used to decouple from the actuation for the working circuit 10 at the control input 40. The diode D prevents negative actuation during the corresponding polarity of the voltage at the working circuit 10.

When the voltage drops below the critical voltage at the Zener diode Z1, which corresponds to a "zero crossover" of the operating voltage (power system voltage) $U_B$ applied between the terminals 20 and 30, the off state of the JFET T1 which is caused by the control transistor T3 via the switching element 2, the MOSFET T2, is cancelled out, as a result of which switching on is brought about again. If the short circuit situation or overload situation no longer applies, the recurring power system voltage $U_B$ drops across the load or during the output-end open-circuit operation. As a result, the protection element 3 which is formed with the JFET T1 continues to be conductive. If, on the other hand, the overload situation or short circuit situation still applies, a voltage will drop across the working circuit 10 again in accordance with the mechanism of action described above and the JFET T1 (protection element 3) will be switched off again according to an embodiment of the invention.

The limiting value of the operating voltage $U_B$ at which the control transistor T3 is switched off is preferably in the region of saturation of the JFET T1 which forms the protection element 3. After the saturation current is reached in the overload situation or short circuit situation in the working circuit 10, a rapid rise of the voltage drop across the working circuit 10 takes place up to a voltage level which is determined by additional connection or an avalanche effect. This voltage drop across the working circuit (cascode) 10 is used to power up the control transistor T3 which is connected upstream, and as a result cause the silicon MOSFET T2, and thus the JFET (SiC transistor) T1, to be switched off. As a result of this switching off, the residual current flowing through the transistors T1 and T2 of the working circuit 10 is limited to such an extent that thermal destruction of the JFET (SiC transistor) T1 is avoided.

The additional connection of the switching off device(s) 4 should be active only in the switched on state of the switching element 2, that is to say when there is a switching signal $U_S$>0 V at its control electrode, in order to minimize possible losses in the off state. For this purpose, the transistor T4 which is installed into the additional branch of the switching off device(s) 4, acts as a voltage-proof switch and together with the MOSFET T2 of the working circuit 10 is activated by the input potential $P_E$ (of the input voltage $U_E$) is used.

As a result of the expansion of the voltage divider in the switching off device(s) 4 by way of the capacitor C1 whose voltage is connected by way of the Zener diode Z1, the control voltage $U_S$ for the switching element 2, the MOSFET T2, is maintained, and the working circuit 10 no longer switches on automatically when the power system voltage decreases, even when the drain voltage at the working circuit 10 decreases. If, in an embodiment which is not illustrated, a suitable discharge resistor is connected in parallel with the capacitor C1, the off state of the transistor T1 can be cancelled again in accordance with the time constant of the discharging after the disappearance of the short circuit or overload situation.

In the embodiment according to FIG. 3, in the event of danger the operating voltage dropping across the working circuit 10 is monitored in order to switch off the MOSFET T2, and thus the working circuit 10, and the switching signal $U_S$=0 V is generated at the MOSFET T2 from this operating voltage when the predefined limiting value is exceeded. The energy at its gate which is necessary to connect through the control transistor T3, that is to say the energy which is required to increase the control signal S at the gate of the control transistor T3, is drawn solely from the operating voltage between the terminals 20 and 30. Extraneous energy is therefore not necessary. The entire switching device including the working circuit 10 and the switching off device(s) 4 and the control input 40 is thus intrinsically safe.

Figure 4:
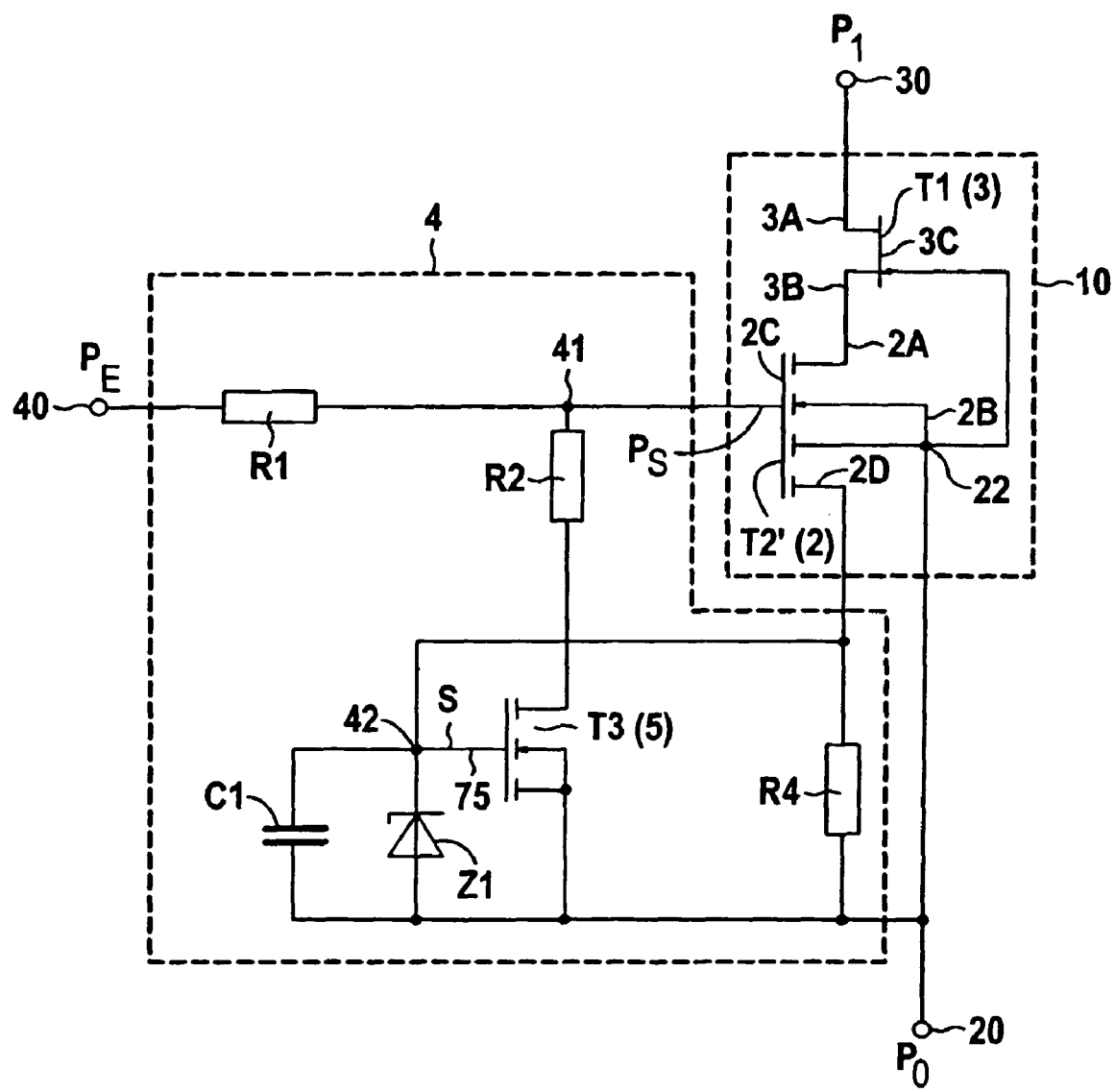
FIG. 4 shows a specific embodiment of a switching device with current-dependent deactivation by way of a transistor circuit and a HITFET as a switching element, illustrated schematically in each case. Corresponding parts are provided with the same reference symbols in FIGS. 1 to 4.

According to FIG. 4, it is not the operating voltage but rather the operating current flowing through the working circuit 10 which is evaluated and used to switch off the working circuit 10 in the event of danger. For this purpose, a HITFET is now provided instead of a simple MOSFET T2 as switching element 2. This HITFET T2 is embodied as a normally-off MOSFET and has, in addition to a normal MOSFET, an additional terminal (pin) which serves as a current monitor (current sense). A current value which corresponds to the operating current (load current) is made available at the additional current output of the HITFET. The tapping voltage which drops across the tapping resistor R4 and which corresponds directly proportionally to the current to be tapped at the current output of the HIFET T2 is tapped by way of the suitably dimensioned tapping resistor R4 which is connected between the current monitor output of the HITFET T2 and the terminal 20. This tapping voltage is then used by a circuit—of analogous design to that in FIG. 3—composed of the control transistor T3 as control switch 5, Zener diode Z1 and capacitor C1 connected in parallel, and decoupling resistor R2, in order to connect the gate of the HITFET T2 to the potential $P_0$ which is present at the terminal 20, when the operating current which flows through the working circuit 10 exceeds a permissible limiting value.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A switching system for switching alternating currents in a line branch, comprising:
    at least two switching devices connected in antiserial configuration into the line branch, each of the at least two switching devices including
        a working circuit, to which an operating voltage is at least one of applied and applicable, including,
            at least one electronic switching element including at least one control terminal for applying a switching signal, adapted to be, depending on the switching signal, switched in at least one of an off state and an on state, and
            at least one electronic protection element for protecting the switching element in its switched on state from excessively high Joule losses in the event of an overload or a short circuit, wherein the protection element bears a predominant part of the operating voltage which drops across the working circuit; and
        switching off means for, in the event of an overload or a short circuit, automatically switching the switching element into the switched off state, using the energy contained in at least one of the operating current and the operating voltage, when at least one of the operating current flowing through the working circuit and the voltage which drops across at least one of the working circuit and the protection element, exceeds a predefined upper limiting value, wherein the switching off means maintains the switched off state of the switching element at least for a predefined minimum time interval, even if the overload or short circuit is no longer occurring, and wherein the operating voltage being an alternating voltage and the minimum time interval being chosen to be at least as long as half the period length of the operating alternating voltage.

2. The switching system as claimed in claim 1, wherein the switching off means includes,
an output, connected to the control terminal of the switching element, and
two inputs, connected to the working circuit and at which at least one, of the operating voltage which drops across the working circuit and a part of the operating voltage which drops across the protection element and the operating current flowing through at least one of the working circuit and a part thereof which is branched off, is at least one of tapped and tappable, wherein, if the overload or short circuit occurs, they are adapted to apply a switching signal for the switching element to the output, with which the switching element is switched off.

3. The switching system as claimed in claim 2, wherein the switching off means includes a control switch, the control switch being connected between the control terminal of the switching element and a switching point to which a signal which corresponds to a switching signal with which the switching element is switched off is at least one of applied and appliable, wherein a control signal is at least one of applied and appliable to a control terminal of the control switch, and wherein the control signal is at least one of generated and branched off from at least one of the operating voltage and the operating current, and depends on at least one of the operating voltage and the operating current in such a way that the control switch is switched on if the overload or short circuit occurs, and switched off if the overload or short circuit does not occur.

4. The switching system as claimed in claim 3, wherein the switching off means includes a voltage divider device for generating the control signal for the control switch from the operating voltage.

5. The switching system as claimed in claim 1, wherein, in at least one of the switched on state and off state of the switching element and in the nonconducting direction, the protection element bears at least predominantly the operating voltage.

6. The switching system as claimed in claim 1, wherein the protection element bears at least one of the applied and dropping voltage across at least one of at least one p-n type junction and at least one Schottky junction.

7. The switching system as claimed in claim 1, wherein at least one of the protection element and the switching element includes at least one JFET structure.

8. The switching system as claimed in claim 7, wherein the gate terminal of at least one of the JFET structure and a MESFET structure of the protection element is connected to the source terminal of the a MISFET structure of the switching element, and the source terminal of at least one of the JFET structure and MESFET structure is connected to the drain terminal of the MISFET structure.

9. The switching system as claimed in claim 1, wherein at least one of the protection element and the switching element includes at least one MESFET structure.

10. The switching system as claimed in claim 1, wherein the switching element includes at least one MISFET structure.

11. The switching system as claimed in claim 1, wherein, in the event of an overload or a short circuit, the protection element bears a greater proportion of the dropping operating voltage than in a rated operating mode in the case of lower operating currents.

12. The switching system as claimed in claim 1, wherein the upper limiting value which determines the switching off in the event of an overload or a short circuit lies in a saturation range of the protection element.

13. The switching system as claimed in claim 1, wherein the protection element has a saturation current which is lower than a thermal limiting current of the switching element.

14. The switching system as claimed in claim 1, wherein, in the event of an overload or a short circuit, the protection element bears at least 70% of the operating voltage.

15. The switching system as claimed in claim 1, wherein the protection element limits the part of the operating voltage dropping across the switching element in its switched on state to a maximum voltage limiting value.

16. The switching system as claimed in claim 1, wherein the switching device is connected into a line branch of an electrical supply power system upstream of an electrical load.

17. The switching system as claimed in claim 1, wherein the protection element includes at least one semiconductor from the group of semiconductors comprising α- or β-polytype, gallium nitride (GaN), diamond, aluminum nitride (AlN) and indium nitride (InN).

18. The switching system as claimed in claim 1, wherein the switching element includes at least one MOSFET structure.

19. The switching system as claimed in claim 1, wherein the switching element includes at least one MOSFET structure of the normally-off type.

20. The switching system as claimed in claim 1, wherein the protection element has a saturation current which is lower than a thermal limiting current of the switching element by at least a factor of 2.

21. The switching system as claimed in claim 1, wherein the protection element has a saturation current which is lower than a thermal limiting current of the switching element by at least a factor of 3.

22. The switching system as claimed in claim 1, wherein, in the event of an overload or a short circuit, the protection element bears at least 90% of the operating voltage.

23. The switching system as claimed in claim 1, wherein the protection element limits the part of the operating voltage dropping across the switching element in its switched on state to a maximum voltage limiting value of at most 100 V.

24. The switching system as claimed in claim 1, wherein the protection element limits the part of the operating voltage dropping across the switching element in its switched on state to a maximum voltage limiting value of at most 50 V.

25. The switching system as claimed in claim 1, wherein—the switching off means includes a control switch, the control switch being connected between the control terminal of the switching element and a switching point to which a signal which corresponds to a switching signal with which the switching element is switched off is at least one of applied and appliable, wherein a control signal is at least one of applied and appliable to a control terminal of the control switch, and wherein the control signal is at least one of generated and branched off from at least one of the operating voltage and the operating current, and depends on at least one of the operating voltage and the operating current in such a way that the control switch is switched on if the overload or short circuit occurs, and switched off if the overload or short circuit does not occur.

26. The switching system as claimed in claim 25, wherein the control switch includes at least one MISFET.

27. The switching system as claimed in claim 25, wherein the control switch includes at least one MOSFET.

28. The switching system as claimed in claim 25, wherein the switching off means includes a voltage divider device for generating the control signal for the control switch from the operating voltage.

29. The switching system as claimed in claim 25, wherein the switching off means includes a tapping resistor, connected into the current path at least one of for the operating current and for a branched off current which has a uniquely defined relationship with the operating current, adapted to generate the switching signal from the tapping voltage which is tapped at the tapping resistor.

30. The switching system as claimed in claim 29, wherein the switching element includes a HITFET with a current monitor output, the switching off means tapping, at the current monitor output, at least one of the operating current and a current signal which is dependent on the operating current in a uniquely defined fashion in order to generate the switching signal which is at least one of applied and appliable to the control terminal of the HITFET and wherein the tapping resistor of the switching off means is connected to the current monitor output of the HITFET.

31. The switching system as claimed in claim 25, wherein the signal at least one of applied and appliable to the switching point assigned to the control switch is an essentially constant electrical potential.

32. The switching system as claimed in claim 25, wherein a decoupling resistor is connected between the control terminal of the switching element and the switching point and in series with the control switch.

33. The switching system as claimed in claim 25, wherein the control switch includes at least one control transistor.

34. The switching system as claimed in claim 25, wherein the switching off means includes at least one capacitor for maintaining the switching signal, corresponding to the switched off state of the switching element, for the switching element, and wherein the capacitor is connected between the control terminal of the control switch and the switching point assigned to the control switch.

35. The switching system as claimed in claim 34, wherein a Zener diode is connected between the control terminal of the control switch and the switching point assigned to the control switch and wherein the capacitor and the Zener diode are connected in parallel.

36. The switching system as claimed in claim 25, wherein a Zener diode is connected between the control terminal of the control switch and the switching point assigned to the control switch.

37. The switching system as claimed in claim 25,— wherein the working circuit includes at least two terminals to which the operating voltage is at least one of applied and appliable and between which the switching element and the protection element are electrically connected in series, and wherein a first terminal of the two terminals of the working circuit is connected to the switching point assigned to the control switch.

38. The switching system as claimed in claim 37, wherein a voltage-proof switch is connected between the control terminal of the control switch and a second terminal of the two terminals of the working circuit.

39. The switching system as claimed in claim 38, wherein a control terminal of the voltage-proof switch is connected to the control switch, and the control switch switches on the voltage-proof switch and is connected together with the switching element.

40. The switching system as claimed in claim 37, wherein a diode is connected between the control terminal of the control switch and the second terminal of the working circuit.

41. The switching system as claimed in claim 37, wherein an intermediate resistor is connected between the control terminal of the control switch and the second terminal of the working circuit.

42. The switching system as claimed in claim 1, wherein the switching off means includes at least one capacitor for maintaining the switching signal, corresponding to the switched off state of the switching element, for the switching element.

43. The switching system as claimed in claim 42, wherein a discharging resistor is connected in parallel to the capacitor, resulting the minimum time interval for maintaining the switching signal being dependent on the discharging time of the capacitor.

44. The switching system as claimed in claim 1, wherein the working circuit includes at least two terminals to which the operating voltage is at least one of applied and appliable and between which the switching element and the protection element are electrically connected in series.

45. The switching system as claimed in claim 1, wherein the switching element includes a HITFET with a current monitor output, the switching off means tapping, at the current monitor output, at least one of the operating current and a current signal which is dependent on the operating current in a uniquely defined fashion in order to generate the switching signal which is at least one of applied and appliable to the control terminal of the HITFET.

46. The switching system as claimed in claim 1, further comprising control means at least one of connected and connectable to the control terminal of the switching element in order to apply a switching signal for the switching element.

47. The switching system as claimed in claim 46, wherein the control means determine the switched state of the switching element if the overload or short circuit does not occur, and wherein the switching off means determine the switched state of the switching element if the overload or short circuit least one of occurs and is occurring.

48. The switching system as claimed in claim 46, wherein the control means activate the switching off means if the switching element is in the switched on state, and deactivate them if the switching element is in the switched off state.

49. The switching system as claimed in claim 48, wherein a control terminal of a voltage-proof switch is connected to the control means, and the control means switch on the voltage-proof switch is connected together with the switching element.

50. The switching system as claimed in claim 1, wherein the protection element includes at least one semiconductor with a breakdown field strength of at least one of $10^6$ V/cm and an energy gap of at least 2 eV.

51. The switching system as claimed in claim 1, wherein the switching element includes at least one semiconductor from the group of semiconductors comprising silicon (Si), gallium arsenide (GaAs), germanium (Ge).

52. A switching system for switching alternating currents in a line branch, comprising:
- at least two switching devices connected in antiserial configuration into the line branch, each of the at least two switching devices including
  - a working circuit, to which an operating voltage is at least one of applied and appliable, including,
    - at least one electronic switching element including at least one control terminal for applying a switching signal and, depending on the switching signal, adapted to be in at least one of a switched off state and a switched on state, and
    - at least one electronic protection element for protecting the switching element in its switched on state from excessively high Joule losses in the event of an overload or a short circuit, wherein the protection element bears a predominant part of the operating voltage which drops across the working circuit; and
  - switching off means for, in the event of an overload or a short circuit, automatically switching the switching element into the switched off state, using the energy contained in at least one of the operating current and the operating voltage, when at least one of the operating current flowing through the working circuit, the voltage which drops across the working circuit, and the voltage which drops across the protection element, exceeds a predefined upper limiting value, wherein, in at least one of the switched off state and on state of the switching element, the protection element bearing at least predominantly the operating voltage.

53. A method for operating a switching system, comprising:
- providing a switching system for switching alternating currents in a line branch including at least two switching devices connected in antiserial configuration into the line branch, each of the at least two switching devices including—a working circuit, to which an operating voltage is at least one of applied and appliable and including at least one electronic switching element including at least one control terminal for applying a switching signal and which, depending on the switching signal, is in at least one of a switched off state and in a switched on state, the working circuit further including at least one electronic protection element which, in the event of an overload or a short circuit bears a predominant part of the operating voltage which drops across the working circuit in order to protect the switching element from excessively high Joule losses if the switching element is in its switched on state;
- automatically switching, in the event of an overload or a short circuit, the switching element into the switched off state, using the energy contained in at least one of the operating voltage and the operating current, when at least one of the operating current flowing through the circuit, the operating voltage which drops across the working circuit, and the part of the operating voltage which drops across the protection element exceeds a predefined upper limiting value; and
- maintaining the switched off state of the switching element at least for a predefined minimum time interval even if the overload or short circuit is no longer occurring, wherein the operating voltage is an alternating voltage and the minimum time interval is chosen to be at least as long as half the period length of the operating alternating voltage.

* * * * *